United States Patent [19]
Jubinsky et al.

[11] Patent Number: 5,227,280
[45] Date of Patent: Jul. 13, 1993

[54] RESISTS WITH ENHANCED SENSITIVITY AND CONTRAST

[75] Inventors: James A. Jubinsky, Ulster Park, N.Y.; Steven M. Katz, Baltimore, Md.; Christopher F. Lyons, LaGrangeville; Wayne M. Moreau, Wappingers Falls, both of N.Y.

[73] Assignee: International Business Machines Corporation, Armonk, N.Y.

[21] Appl. No.: 754,847

[22] Filed: Sep. 4, 1991

[51] Int. Cl.⁵ .................. G03C 1/52; G03C 5/16
[52] U.S. Cl. ..................... 430/312; 430/156; 430/165; 430/166; 430/192; 430/270; 430/326
[58] Field of Search .............. 430/156, 165, 166, 192, 430/191, 270, 312, 325, 326

[56] References Cited

U.S. PATENT DOCUMENTS

| | | | |
|---|---|---|---|
| 3,873,361 | 3/1975 | Franco et al. | 430/324 |
| 4,009,033 | 2/1977 | Bakos et al. | 430/191 |
| 4,211,834 | 7/1980 | Lapadula et al. | 430/326 |
| 4,442,195 | 4/1984 | Yamamoto et al. | 430/191 |
| 4,524,121 | 6/1985 | Gleim et al. | 430/176 |
| 4,806,453 | 2/1989 | Vidusek et al. | 430/156 |

Primary Examiner—Charles L. Bowers, Jr.
Assistant Examiner—Mark F. Huff
Attorney, Agent, or Firm—John A. Stemwedel; Dale M. Crockatt

[57] ABSTRACT

A PMGI bilayer resist for integrated circuit fabrication having increased sensitivity to light and formed by the addition of cyclic anhydrides to the resist and the formation of an accompanying bilayer resist structure of a portable conforming mask having a desirable undercut profile for lift-off of patterned metallic circuitry.

4 Claims, 2 Drawing Sheets

Continued on next page...

RESISTS WITH ENHANCED SENSITIVITY AND CONTRAST

FIELD OF INVENTION

The invention relates to the inclusion of additives in polydimethylglutarimide (PMGI) containing resist compositions and methods for using such compositions as single layer resists in portable conformable mask and lift-off processes. More particularly, the present invention is concerned with the use of certain cyclic anhydrides to enhance the sensitivity of PMGI resist compositions.

BACKGROUND ART

In the additive process of depositing patterned metal films known as the lift-off process which entails depositing a resist film on a substrate and transferring a pattern to such film followed by the blanket deposition of a thin layer of metal in order to reproduce the pattern with the metal. The resist serves as a deposition mask separating the desired metal pattern from the excessive metal by the vertical thickness gap of 1-2 $\mu$m (i.e., the resist thickness). Generally the resist thickness is twice the thickness of the metal film deposition thickness. Since it is difficult to create a desirable undercut profile in a single resist layer, multiple resist layer processes have been developed in which a bilayer or trilayer structure is sequentially patterned by series of exposure and development steps using ultraviolet radiation (portable conformable mask (PCM) process as is set forth in U.S. Pat. No. 4,211,834 to Lapadula et al.) or a reactive ion etch process using a patterned metallic or other inorganic masking layer over a polymeric layer for pattern transfer and metal deposition (see, for example the process described in U.S. Pat. No. 3,873,361 to Franco et al.)

In a typical PCM process as shown in FIG. 2, a substrate 10 upon which a line or feature is to be placed has a planarizing underlayer 12 deposited or coated thereon. The underlayer is a deep UV resist composition such as the polyglutarimide sold commercially as Shipley (SAL) resist. This underlayer is patternable with deep UV (200-300 nm) radiation. A top image layer 14 is deposited over the underlayer. The top image layer is typically a diazoquinonesensitized novolak resin (DQN) resist which is patternable in near UV (350-450 nm) radiation.

The bilayer resist is imaged with near UV radiation through a mask to form a latent image 16A in the top imaging layer as is shown in FIG. 2A. This image is developed and will have a profile 16B as may be seen in FIG. 2B.

The pattern formed by openings 16B in the top layer 14 serves as a contact printing mask to enable flood or blanket deep UV exposure to transfer a latent image 16C into underlayer 12. This image is developed as is best seen in FIG. 2C to form the profile of the opening 16D which is characterized in having sloped foot 18. This profile serves as the deposition and lift-off mask for forming Al-Cu metallurgy patterns of the order of 0.5-2.5 $\mu$m in width and 0.5-1.0 $\mu$m in thickness on semiconductor substrates. The profile formed using a typical diazonaphthoquinone sensitized AZ-1350 (DQN)/PMGI bilayer structure suffers from a protruding foot at the PMGI-silicon wafer interface.

Metallization may be by any conventional method including evaporation, sputtering, or the like to provide a metallized structure as is shown in FIG. 2D with blanket metal 20 covering the bilayer resist and the metal line or feature 20' on the substrate.

FIG. 2E shows the completion of metal lift off wherein the line or feature 20' has a protruding fence metal which may cause shorts or dielectric breakdown between it and adjacent conductive features. The protruding foot of resist leads to undesirable extra metal fences 22 at the edges of the unlifted metal circuitry. The extraneous metal tips induce short circuiting by contact with adjacent circuit lines.

An improved process was provided in U.S. Pat. No. 4,814,258 to Tam which is set forth in FIG. 3. The steps and materials are the same as those in FIG. 2 except before the planarizing underlayer 12 was soaked in chlorobenzene to increase its solubility in the developer with respect to the photoresist layer 14 which is the applied and which is exposed and developed to give the image 16B as is shown in FIG. 3A.

The image 16D is undercut at the top to enable the imaging layer 14 to overhang the planarizing layer 12 and leaves somewhat of a foot 18A. This foot leaves the opportunity for fencing as was seen in FIG. 2. The resulting profile 16 after the chlorobenzene soak exhibits its lateral undercut 18A at the DQN/PMGI interface which in the case of closely spaced metal lines (FIG. 3B) defined by the DQN/PMGI interface tends to further undercut at the DQN/PMGI interface and finally topple the resist structure. The protruding foot at the PMGI/silicon interface is not effectively removed. Secondly, the process of soaking an organic resist layer in a solvent involves a separate process step using chemicals of a flammable and toxic nature with the added cost of storage, safety, and disposal. Thirdly, the soak process is isotropic and subject to many factors of diffusion such as the prebake conditions of the PMGI layer, the time, temperature of soaking, the shelf or use life of the chlorobenzene bath, and the purity of the chlorobenzene soaking material.

The formation of an image in the PMGI planarizing layer involves a deep UV exposure of a considerable dose of the order of 500–2000 mJ/cm$^2$ and exposure times of several minutes in order to induce sufficient solubility of the PMGI in alkaline developers. Long exposure times with large 200 mm diameter wafers can add extra costs when using a PCM process. Attempts to decrease the exposure time of positive resists of the DQN type have used additives of alkaline soluble substances such as acids (U.S. Pat. No. 4,009,033). The addition of these acids also significantly result in loss of unexposed resist resulting in more pinholes, and insufficient step coverage over topography. Shorter exposure times at the expense of film thinning is to be avoided. In another system, diazoquinone sensitizers are added directly to the PMGI resist (U.S. Pat. No. 4,524,121). High doses are still required (1500–3000 mJ/cm$^2$ in the near UV region). For a PCM application, the presence of a diazoquinone in the novolak toplayer and in the PMGI underlayer provides no discrimination to the near UV light used to image the DQN toplayer. The diazoquinone in the PMGI layer would also be exposed by the near UV light resulting in sloping resist profiles unsuitable for lift-off. The toplayer of DQN would also have to be >1.5 $\mu$m thick to avoid imaging the PMGI layer with near UV light. For exposure tools of high numerical aperture, the depth of focus of the tools is close to 1.5 $\mu$m in range and thus thick resist films >1.5

μm in the DQN imaging layer are to be avoided since blurred images will be produced.

SUMMARY OF THE INVENTION

It is an object of this invention to provide a faster PMGI resist for shorter exposure time, higher process throughput, and lower net costs to metal pattern definition.

It is a further object of the present invention to provide a simplified lower cost and a new and novel improved bilayer PCM process which facilitates the formation of closely spaced micron metal lines for higher density circuitry with improved process yields.

Furthermore, it is an object of the present invention to provide a new and improved bilayer liftoff process wherein uniform lateral undercutting of the PMGI layer can be achieved without affecting the uppermost portion of the PMGI underlayer and without affecting the imaged toplayer of the DQN resist.

These and other objects and advantages are achieved by addition of cyclic anhydride compounds to the PMGI resist which result in increased photospeed and desirable profile features. Other objects and advantages of the present invention will become more apparent to those skilled in the art upon consideration of the accompanying drawings, examples, and claims. a

DETAILED DESCRIPTION OF THE INVENTION

Figure 1:
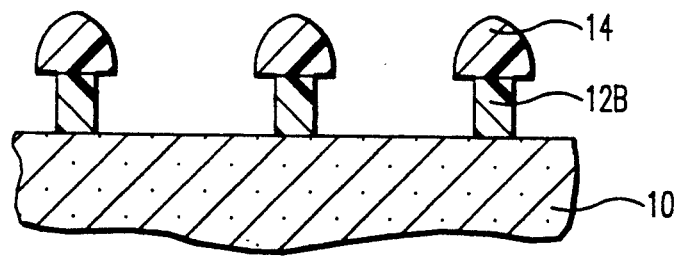
FIG. 1 illustrates a liftoff pattern in accordance with the invention.
Figure 2A:
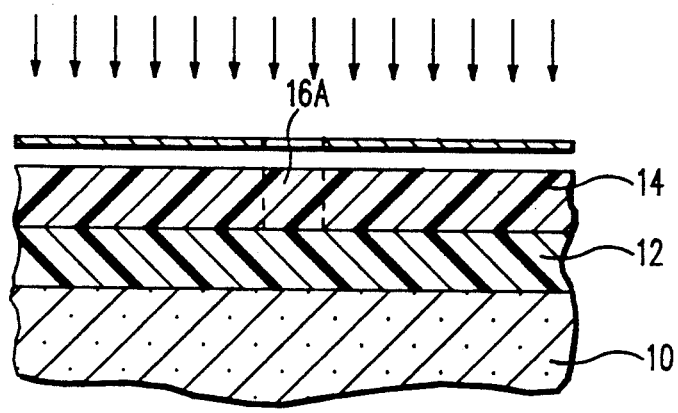
FIGS. 2A, B, C, D and E illustrate a prior art bilayer PCM resist lift-off process.
Figure 2B:
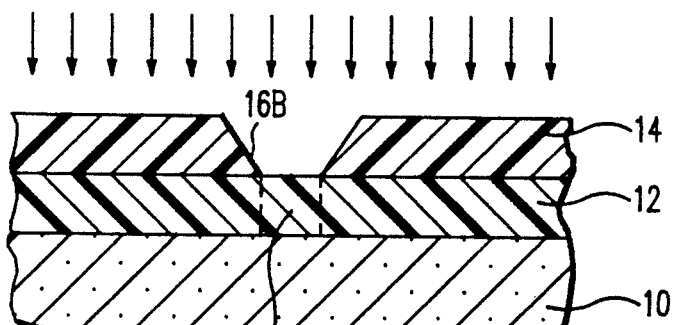
Figure 2C:
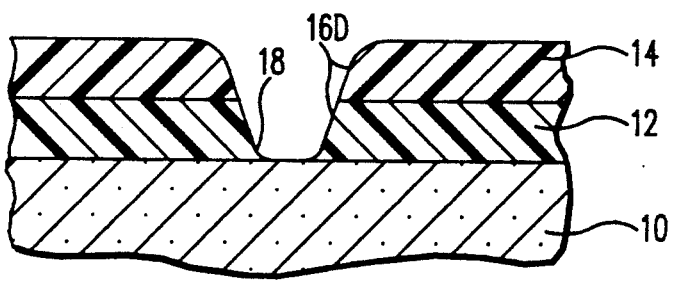
Figure 2D:
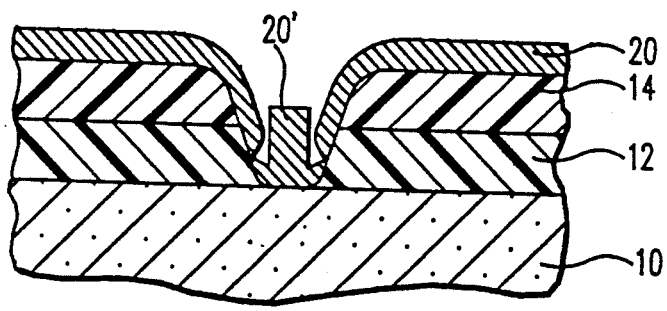
Figure 2E:
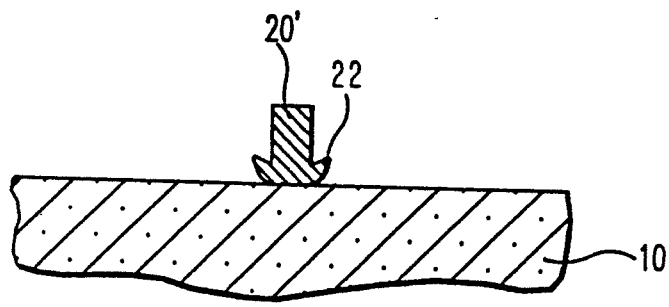

With reference to FIG. 2, the steps of the prior art of using PMGI layer 12 in a PCM bilayer process is shown using a DQN resist 14 of the type described in U.S. Pat. Nos. 3,046,118; 3,106,465, and 3,402,044. As is best seen in FIG. 2B, the image 16B produced in the DQN layer 14 on a silicon substrate 10, is transferred through the PMGI layer 12 by deep UV exposure and development in tetramethyl ammonium hydroxide (TMAH) developer. The protruding foot 18 of the PMGI resist leads to excessive metal fences in subsequent metal deposition and lift off as shown in FIGS. 2D and 2E. The metal 22 at the edges of the deposited metal 20 leads to metal protrusions which can result in line short circuiting. The fence like protrusions can also break off and redeposit as free metal pattern definition. Steeper resist profiles in the PMGI layer without protruding feet are desired.

Figure 3A:
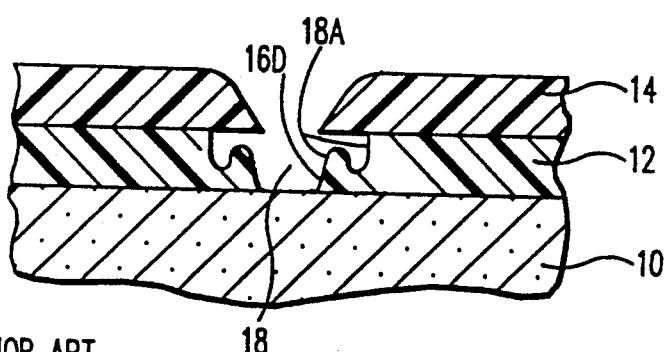
FIGS. 3A and B illustrate a solvent enhanced prior art PCM lift off process.
Figure 3B:
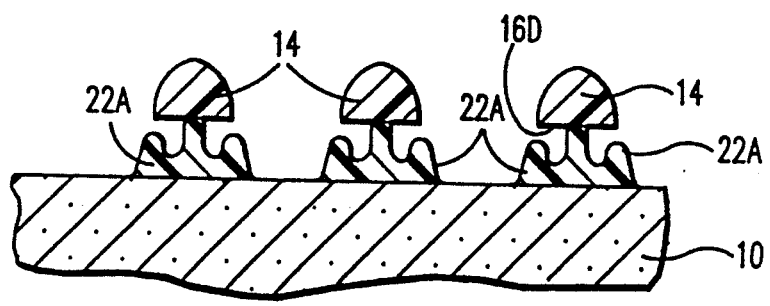

The process of U.S. Pat. No. 4,814,258 as illustrated in FIG. 3 involves a chlorobenzene soak of the PMGI layer 12 prior to the application of the DQN layer 14. This process leads to a topside undercut 18A of the layer 12 as seen in FIG. 3A. This process does not eliminate the "feet" which produce unwanted metal "fences". If the process is extended to closely spaced features (pitch of 1-2 μm lines <4 μm) as shown in FIG. 3B, the lift off profile 22A in the PMGI layer 12 is subject to pattern toppling due to the lack of sufficient support at 22A to withstand the stress of the deposited metal. The support 22A is too narrow in width ("necking") to support an upper structure of DQN pattern and deposited metal.

The present invention enables the formation of stable profiles for lift-off with uniform PMGI supports 12B having a sufficient width and cross section to provide the stable structures, as shown in FIG. 1. It has been found that certain additives to the PMGI resist facilitate the formation of steep undercut supports 12B without the protruding feet 18 as occurs in FIG. 2C, for example. The additives have also been found to decrease the exposure time of the PMGI resist without loss of resist contrast (resolution). Prior attempts to increase the sensitivity of PMGI have included using lower molecular weights or the addition of diazoquinone sensitizers. Both attempts result in poor PMGI resistance when the DQN layer is developed in alkaline developers and the loss of the PMGI contrast (resolution) and exposure process latitude (steep change in linewidth with overdose).

The novel additives of this invention are cyclic anhydrides which may be used alone or in combination from 10–40% by weight with respect to the PMGI component of the liquid resist formulation of PMGI dissolved in a casting solvent The preferred cyclic anhydrides of the invention include succinic anhydride, 5-norbornene-2,3-dicarboxylic anhydride and 1,4,5,6,6,7-hexachloro-5-norbornene-2, 3-dicarboxylic anhydride. These anhydrides mix well with the underlayer resist, but do not bleed or mix into the imaging resist. These characteristics are useful in preventing fencing.

In Table 1, the results of the evaluation of anhydride and other additives tested for contrast, photospeed, and suitability of lift-off profiles are given, sloped as in FIGS. 2 and 3 or steep like in FIG. 1. For contrast and photospeed measurements, cast films of SHIPLEY SAL PMGI resist with and without 20% by weight additives were evaluated by prebaking the cast films at 215° C. for 30 minutes, exposed to a deep UV source of a FUSION Microlite, and developed in 0.147 N TMAH. Film thicknesses were measured of both the remaining exposed and unexposed film for contrast and dose to clear (Eo) for photospeed values. For lift-off profiles, the PMGI layer with and without additives were processed in a conventional manner using a DQN process sequence and evaluated by SEM for metal profiles with no sidewall metal fencing along the walls of the metal circuit lines.

TABLE 1

| EFFECT OF ADDITIVES TO PMGI ON LIFT-OFF | | | |
|---|---|---|---|
| ADDITIVE | REL DUV EXP TIME | CONTRAST | RESIST/METAL PROFILE |
| PMGI ctl | 1.0 | 1.8 | sloped |
| A | 1.0 | 2.1 | sloped |
| B | 1.3 | 2.2 | sloped |
| C | 0.8 | 2.2 | steep |
| D | 0.6 | 2.5 | steep |
| E | 0.8 | 0.8 | steep |

A = 2,2-dimethoxyacetophenone
B = Dichlorodimethylhydantoin
C = 5-Norborene-2,3-dicarboxylic anhydride
D = 1,4,5,6,6,7-Hexachloro-5-norbornene-2,3-dicarboxylic anhydride (HONDA)
E = Succinic anhydride For a portable conformable mask process, the proper exposure dose for the PMGI layer is determined to be when there is no image bias between the top DQN layer 14 of FIG. 2 and the PMGI layer 12 of FIG. 2. For the PMGI layer with no additive, an exposure time of 240 secs. was determined. With PMGI and the HONDA additive, an exposure dose of 100 secs. was noted for suitable steep profiles with no protruding feet 18 in FIG. 2C. A substantial reduction in exposure time for faster throughput and suitable profiled for closely spaced metal features was achieved using the addition of the invention. Without the additive but with the chlorobenzene soaking step, the PMGI layer begins to undercut such as 18A in FIG. 3A at the PMGI/DQN interface. Secondly, if the PMGI layer is over-developed, the DQN layer can topple due to lack of substructural support FIG. B. With the HONDA and the other suitable additives of the invention, no necking and thus lift-off structures can be produced with over-development of the PMGI layer and provides wider process latitude. These improvements can result in a more costeffective PCM process for advanced semiconductor chip manufacture.

The amount of additive was found to be most effective at 20–30% by weight with no change in exposure dose. In Table 2, the results of a photospeed and contrast study of HONDA added to PMGI are given.

TABLE 2

| CONTRAST AND PHOTOSPEED STUDY OF HONDA IN PMGI | | |
|---|---|---|
| Wt % HONDA | REL PHOTOSPEED | CONTRAST |
| none | 1.0 | 1.8 |
| 10.0 | 0.7 | 2.1 |
| 20.0 | 0.5 | 2.4 |
| 30.0 | 0.5 | 2.4 |

It is obvious to those skilled in the art that many modifications may be made within the scope of the present invention without departing from the spirit thereof, and the invention includes all modifications within the scope of appended claims.

We claim:

1. In a portable conformable mask or lift off process of the type having a top layer and an underlayer, which process comprises the steps of
    applying, to a substrate, an underlayer,
    applying, to the underlayer, a top layer,
    patternwise exposing the top layer to actinic radiation to form a latent image in the top layer,
    developing the top layer latent image to form a relief image in the top layer,
    flood exposing the underlayer to optically transfer the relief image from the top layer and thus form a latent image in the underlayer, and
    developing the underlayer latent image to form a bilayer relief image, wherein the improvement consists of:
    applying, to a substrate, an underlayer composition comprising a polydialkylglutarimide in admixture with an additive selected from the group consisting of substituted and unsubstituted 5-norbornene-2,3-dicarboxylic anhydrides and substituted and unsubstituted succinic anhydrides.

2. The process of claim 1 wherein the lateral development of the underlayer composition is approximately equal throughout the depth of the film.

3. The process of claim 2 wherein the relative photospeed of the underlayer composition is increased by a factor about 2.0.

4. The process of claim 1 wherein the top layer consists of a diazoquinone novolak resist top layer.

* * * * *